(12) United States Patent
Grollitsch

(10) Patent No.: US 9,998,128 B2
(45) Date of Patent: *Jun. 12, 2018

(54) FREQUENCY SYNTHESIZER WITH INJECTION LOCKED OSCILLATOR

(71) Applicant: Infineon Technologies AG, Neubiberg (DE)

(72) Inventor: Werner Grollitsch, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days. days.

This patent is subject to a terminal disclaimer.

(21) Appl. No.: 14/681,455

(22) Filed: Apr. 8, 2015

(65) Prior Publication Data

US 2017/0117907 A1 Apr. 27, 2017

(51) Int. Cl.
| | |
|---|---|
| *H03K 3/03* | (2006.01) |
| *H03L 7/099* | (2006.01) |
| *H03L 7/087* | (2006.01) |
| *H03L 7/24* | (2006.01) |
| *H03L 7/091* | (2006.01) |
| *H03L 7/197* | (2006.01) |
| *H03L 7/18* | (2006.01) |
| *H03L 7/08* | (2006.01) |

(52) U.S. Cl.
CPC ......... *H03L 7/0995* (2013.01); *H03K 3/0315* (2013.01); *H03K 3/0322* (2013.01); *H03L 7/0802* (2013.01); *H03L 7/087* (2013.01); *H03L 7/091* (2013.01); *H03L 7/099* (2013.01); *H03L 7/18* (2013.01); *H03L 7/1974* (2013.01); *H03L 7/24* (2013.01)

(58) Field of Classification Search
CPC ......... H03L 7/099; H03L 7/0995; H03L 7/24; H03L 7/091; H03L 7/18; H03L 7/0802; H03L 7/08; H03L 7/1974; H03K 3/0315; H03K 3/0322
USPC ............................................. 331/57, 55, 10
See application file for complete search history.

(56) References Cited

U.S. PATENT DOCUMENTS

| | | |
|---|---|---|
| 6,952,431 B1 | 10/2005 | Dally et al. |
| 7,826,584 B2 | 11/2010 | Paek et al. |
| 9,191,185 B2 | 11/2015 | Chen |
| 2012/0268177 A1* | 10/2012 | Hogeboom ............. H03L 7/099 327/156 |
| 2017/0155395 A1 | 6/2017 | Grollitsch et al. |

OTHER PUBLICATIONS

Prosecution History from U.S. Appl. No. 14/681,239, dated Aug. 24, 2017 through Nov. 6, 2017, 25 pp.
Notice of Allowance from U.S. Appl. No. 14/681,239, dated Jan. 10, 2018, 9 pp.

* cited by examiner

*Primary Examiner* — Arnold Kinkead
(74) *Attorney, Agent, or Firm* — Shumaker & Sieffert, P.A.

(57) ABSTRACT

Representative implementations of devices and techniques provide reduced jitter for a controlled oscillator. An edge of a reference signal is injected at various points within the oscillator, and is replaced for an edge of the generated oscillation signal at the injection point.

26 Claims, 8 Drawing Sheets

A) Fosc = (N+M/(O*P))*Fref = 4.125 * Fref

B) Fosc = (N+M/(O*P))*Fref = 4.4 * Fref

C) Fosc = (N+M/(O*P))*Fref = 4.3 * Fref

A) Fosc = (N+M/(O*P))*Fref = 3.9 * Fref

B) Fosc = (N+M/(O*P))*Fref = 4.4 * Fref

FREQUENCY SYNTHESIZER WITH INJECTION LOCKED OSCILLATOR

BACKGROUND

Phase-locked loop (PLL) devices are control systems that generate signals having a fixed relationship to the phase of a reference signal. Typically, a phase-locked loop device generates a desired signal in response to both the frequency and the phase of the reference signal as well as a control signal. Often this includes raising or lowering the frequency of a frequency generator, such as a digitally controlled oscillator (DCO), a voltage controlled oscillator (VCO), or the like, until a true or modified form (a fraction, for example) of the oscillator output signal is matched with the reference signal in both frequency and phase. Phase-locked loops are widely used in radio, telecommunications, computers, and other electronic applications.

Controlled oscillators may experience jitter, or variations in the timing of the rising and/or falling edges of the periodic signal. Accumulated jitter can cause in-band phase noise, and like negative effects. Some oscillator types (such as ring oscillators, for example) may experience a greater amount of jitter than others at particular frequencies or with some applications, making them less desirable for high-accuracy applications. Additionally, timing issues with correction circuits (such as regulating loops, for instance) used with oscillators to mitigate the effects of temperature and/or supply variations can increase the occurrence of reference spurs and jitter.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
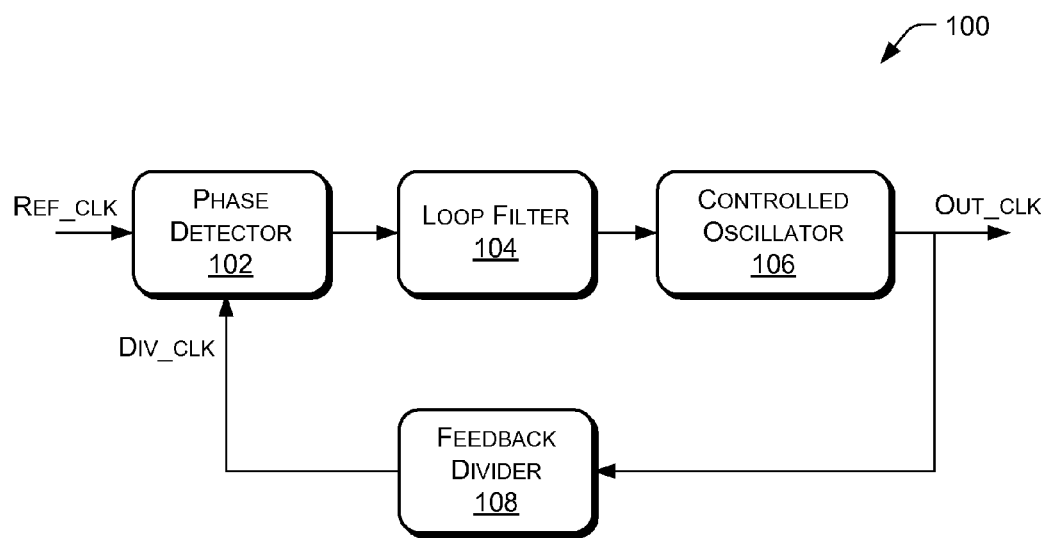
FIG. 1 is block diagram of an example PLL circuit, according to an implementation.

Representative implementations of devices and techniques provide reduced jitter for a controlled oscillator, such as a digitally controlled oscillator (DCO), a voltage controlled oscillator (VCO), or the like. In an implementation, an edge of a reference signal is injected at various points within the oscillator, and replaces an edge of the generated oscillation signal at the injection point (i.e., example of multi-point injection).

In an example implementation, an oscillator circuit, such as a ring oscillator, for example, is comprised of a plurality of inverters and a plurality of multiplexers. In an implementation, the oscillator includes an equal quantity of controllable inverting stages (referred to herein as "inverters") and multiplexing stages (referred to herein as "multiplexers"). In the implementation, each multiplexer is coupled to an output of an inverter at a first input of the multiplexer and each inverter is coupled to an output of a multiplexer at an input of the inverter, forming a loop of alternating inverters and multiplexers. In the implementation, the loop circuit generates an oscillating signal.

In an implementation, each multiplexer is arranged to receive a reference signal at a second input of the multiplexer and to output the reference signal when an enable signal received at the multiplexer is in a first state and to output the oscillation signal (received at the first input of the multiplexer from an inverter) when the enable signal is in a second state. In other words, when the multiplexer is enabled, an edge of the reference signal is replaced. for a corresponding edge of the oscillation signal. This resets the affected edge of the oscillation signal, and reduces jitter of the oscillation signal.

In an implementation, the reference signal edge may be injected at any of multiple stages of the oscillator, when a multiplexer is enabled at that stage. Further, each of the plurality of multiplexers may be enabled in its turn according to a predetermined frequency and in a predetermined order. For example, the oscillator loop is opened at periodic intervals and at various points (e.g., oscillator stages), and an edge of the reference signal replaces a corresponding edge of the oscillation signal at the intervals and at the injection point.

Various implementations and arrangements are discussed with reference to electrical and electronics components and circuits. While specific components are mentioned, this is not intended to be limiting, and is for ease of discussion and illustrative convenience. The techniques and devices discussed with reference to a PLL arrangement are applicable to various types or designs of PLL arrangements, circuits (e.g., integrated circuits, analog circuits, digital circuits, mixed circuits, etc.), groups of components, structures, and the like. Further, the oscillators discussed and illustrated need not be applied solely to PLLs, and may be employed with various other circuits or systems that use a generated periodic or controlled clock signal.

Implementations are explained in more detail below using a plurality of examples. Although various implementations and examples are discussed here and below, further implementations and examples may be possible by combining the features and elements of individual implementations and examples.

Example PLL FIG. 1 is the block diagram of an example PLL arrangement ("PLL") 100, according to an implementation. The PLL 100 represents an example environment whereby the techniques and devices discussed herein may be applied. The techniques, components, and devices described herein with respect to the PLL 100 are not limited to the illustration in FIG. 1, and may be applied to other designs, types, and constructions of PLLs or other similar structures without departing from the scope of the disclosure. In some cases, alternative components may be used to implement the techniques described herein.

In an example implementation, as shown in FIG. 1, the PLL 100 may include a phase detector 102, a loop filter 104, a controlled oscillator (CO) 106, and a feedback divider 108. In general terms, the CO 106 may be arranged to produce an output signal (out_clk) having a frequency proportional to a value of a digital control word. The digital control word is the result of a reference clock signal (ref_clk) and a modified clock signal (div_clk) based on the output out_clk of the CO 106, and is used to adjust or "lock" the frequency of the CO 106 to a desired output frequency. The output out_clk of the CO 106 is also the output of the PLL 100.

In various implementations, the CO 106 may comprise one of various controlled oscillators, such as a digitally controlled oscillator (DCO), a digitally controlled ring oscillator (DCRO), a voltage controlled oscillator (VCO) or the like.

In an implementation, the feedback divider 108 is arranged to provide the modified clock signal div_clk based on the output signal out_clk from the CO 106 and a divider value. For example, as shown in FIG. 1, the output out_clk of the CO 106 is fed back through the feedback divider 108. The feedback divider 108 divides the frequency of the output signal out_clk by the divider value to produce the modified clock signal div_clk.

In the example, the reference clock signal ref_clk and the modified clock signal div_clk are received by the phase detector 102. In other implementations, the phase detector 102 receives the reference clock signal and the output signal out_clk, or oscillation signal. In an implementation, the phase detector 102 senses a phase difference between the reference clock signal ref_clk and the output clock signal out_clk or the modified clock signal div_clk and outputs a signal that is a representation of the phase difference detected. In one implementation, as discussed further below, the phase detector 102 may be arranged to detect whether a phase of the reference clock signal ref_clk leads or lags a phase of the output clock signal out_clk or modified clock signal div_clk.

The loop filter 104 is arranged to form the digital control word based on the representation of the phase difference from the phase detector 102. In an implementation, the loop filter 104 comprises a digital loop filter. The digital control word may contain the phase difference information from the output of the phase detector 102. Accordingly, the digital control word prompts the CO 106 to increase its output frequency or decrease its output frequency based on the phase difference indicated by the digital control word. For example, if the reference clock signal ref_clk is leading the output clock signal out_clk or modified clock signal div_clk, the digital control word may prompt the CO 106 to increase its output frequency. Conversely, if the reference clock signal ref_clk is lagging the output clock signal out_clk or modified clock signal div_clk, the digital control word may prompt the CO 106 to decrease its output frequency. In alternate implementations, this may occur in a different manner for the leading and lagging conditions. Further, in some implementations, the loop filter 104 may comprise an analog filter, arranged to generate a control signal to prompt the CO 106 to increase or decrease its frequency in a similar manner.

In alternate implementations, variations of a PLL 100 are also within the scope of the disclosure. The variations may have fewer elements than illustrated in the example shown in FIG. 1, or they may have more or alternative elements than those shown.

Example Injection-Locked PLL

Figure 2:
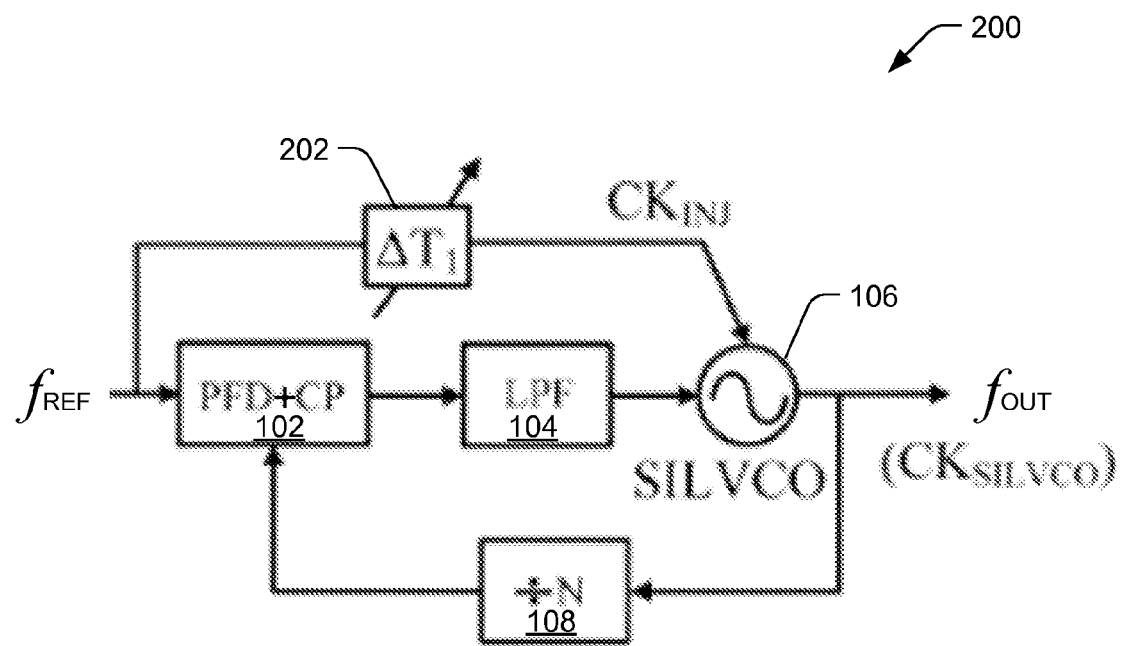
FIG. 2 is a block diagram of another example PLL circuit, including oscillator injection, according to an implementation.

FIG. 2 is a block diagram of another example PLL arrangement ("PLL") 200, according to an implementation. The PLL 200 illustrates an example PLL with a voltage controlled oscillator (VCO) 106, phase/frequency detector and charge pump 102, low pass filter 104, and frequency divider 108. The design of the PLL 200 of FIG. 2 is not intended to be limiting, and an example PLL 200 may include other analog and digital PLL arrangements having alternate or additional components.

Figure 3A:
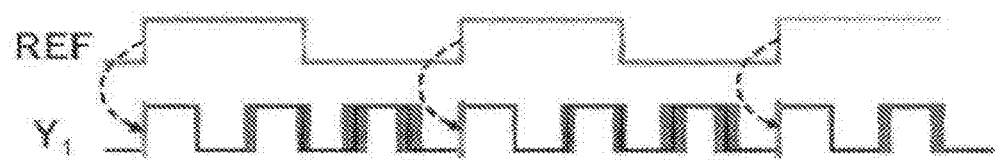
FIG. 3A is a signal diagram showing an example of reference signal injection, according to an implementation.
Figure 3B:
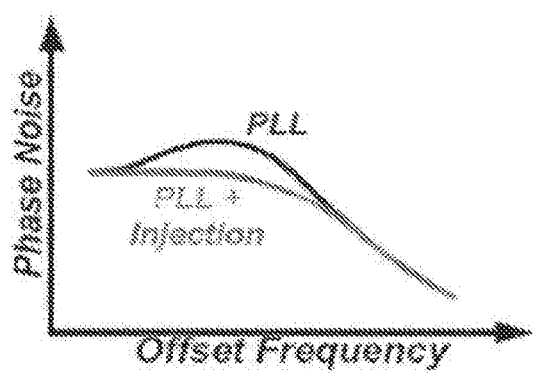
FIG. 3B is a graphical representation of the phase noise behavior, illustrating an example result of reference signal injection, according to an implementation.

The PLL 200 illustrates an example PLL having a clock injection "CLKinj" at the oscillator 106. Injection locked PLLs, such as the PLL 200, offer the possibility of reducing the jitter of the controlled oscillator 106 by injecting a reference clock, CLKinj, directly into the oscillator 106 core. For example, as shown in FIG. 3A, injecting the reference clock ("REF") can realign the VCO 106 clock phase ("Y1") with the reference clock phase. This arrangement provides a technique of "resetting" the jitter accumulated during a reference cycle, for example. In various arrangements, as shown in FIG. 3B, the in-band phase noise may be reduced as a result. The cut-off frequency shown in FIG. 3B may occur at approximately Fref/2 (depending on the injection strength).

By making use of the injection technique illustrated, ring oscillators for example, can be used to replace LC-oscillators for high accuracy applications, making efficient use of die area. However, in some examples, the PLL arrangement 200 may be limited to synthesis of integer-N multiple frequencies of the reference frequency, due to the reference clock, CLKinj, being injected into the same oscillating node of the VCO 106 in each cycle, for instance.

In order to track the reference frequency (e.g., correct the frequency due to temperature and/or supply variations), a regulating loop 202 can be used. However, timing differences between the injection point and the correcting circuit (PFD 102) can result in increased reference spurs and jitter in some cases.

Example Multi-Point Injection

Figure 4A:
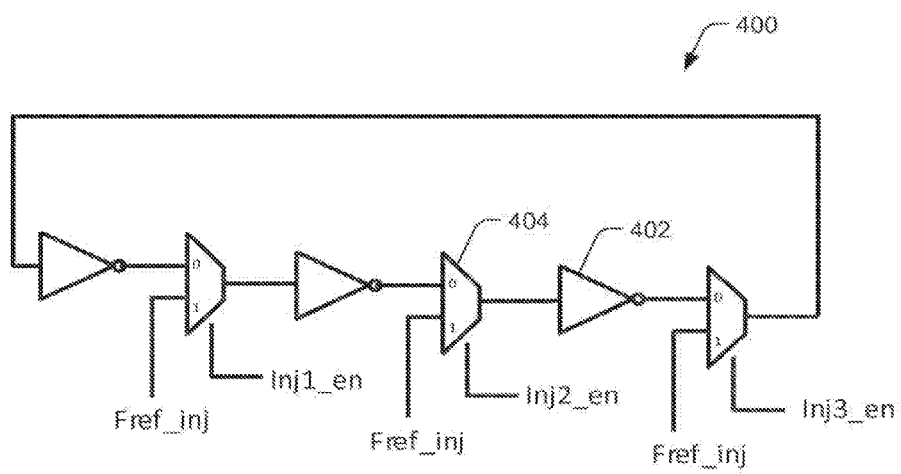
FIG. 4A is a schematic diagram of an example multi-point injected oscillator circuit, according to an implementation.

FIG. 4A is a schematic diagram of an example multi-point injected oscillator circuit 400, which may be employed as the oscillator 106 with a PLL arrangement such as the PLL 100 of FIG. 1, the PLL 200 of FIG. 2, or the like, according to various implementations. Further, the oscillator 400 may be employed in various other circuits and/or systems that use a generated periodic or controlled clock signal.

In one implementation, the oscillator 400 is a ring oscillator circuit. In other implementations, the oscillator 400 is another type of oscillator circuit. In various implementations, the oscillator 400 includes a plurality of inverters 402 (e.g., controllable inverting stages) and a plurality of multiplexers 404 (e.g., controllable multiplexing stages). For example, in some implementations, the oscillator 400 includes an odd quantity of inverters 402 and an equal quantity of multiplexers 404. The illustration of FIG. 4A shows a circuit with three each inverters 402 and multiplexers 404 as an example. In various implementations, other even or odd quantities of inverters 402 and multiplexers 404 may be used.

In an implementation, as shown in FIG. 4A, the inverters 402 and the multiplexers 404 are coupled in a loop. In an implementation, a multiplexer 404 is coupled to an output of each inverter 402 at a first input of the multiplexer 404, and an inverter 402 is coupled to an output of each multiplexer 404 at an input of the inverter 402. In the implementation, the plurality of inverters 402 and the plurality of multiplexers 404 generate an oscillating signal (i.e., the oscillation signal) when energized. Accordingly, the oscillation signal is formed and maintained as the signal is output from an inverter 402 and input at a first input of a multiplexer 404, then output from the multiplexer 404 and input at another inverter 402, then output from the inverter 402 and input at a first input of another multiplexer 404, and so forth continuously.

In an implementation, as illustrated in FIG. 4A, the oscillator 400 includes multi-point injection of a reference signal. In the implementation, an edge of the reference clock is injected into different points of the oscillator 400. For example, each multiplexer 404 is arranged to receive the reference signal (Fref_inj, for example) at a second input of the multiplexer 404, as shown in FIG. 4A. In the implementation, a multiplexer 404 outputs the reference signal (instead of the oscillation signal) when an enable signal (e.g., Inj1_en, Inj2_en, Inj3_en) received at the multiplexer 404 is in a first state (e.g., when the multiplexer is enabled). Further, the multiplexer 404 outputs the oscillation signal (received at the first input of the multiplexer 404) when the enable signal is in a second state (when the multiplexer is not enabled, for example).

Figure 4B:
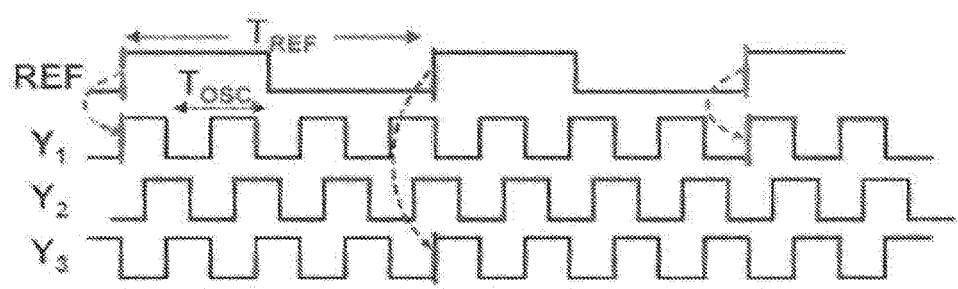
FIG. 4B is an example signal diagram showing multi-point reference signal injection, according to an implementation.

An example multi-point injection technique can be illustrated using the timing diagram of FIG. 49. For example, FIG. 4B shows the reference signal ("REF") and the oscillation signal from three perspectives (e.g., Y1, Y2, and Y3), representing the oscillation signal as seen at each of three multiplexers 404 (as illustrated in FIG. 4A, for example) of the circuit 400. For example, the signal Y1 may correspond to the oscillation signal viewed at a first multiplexer 404, the signal Y2 may correspond to the oscillation signal viewed at a second multiplexer 404, and the signal Y3 may correspond to the oscillation signal viewed at a third multiplexer 404, for a three-multiplexer 404 oscillator circuit 400.

In the example shown in FIG. 4B, the reference signal is shown as a periodic pulse signal having rising and falling edges and a period Tref, and the oscillation signal is shown as a periodic signal having rising and falling edges and a period of Tosc. In an implementation, the loop of the oscillator circuit 400 is opened at periodic intervals and an edge of the reference signal is replaced for an edge of the oscillation signal at the intervals (as indicated by the dashed arrows). In other words, the reference signal edge replaces the corresponding oscillation signal edge at the point of injection (e.g., at an enabled multiplexer 404).

In an implementation, injecting the reference signal edge at a multiplexer 404 and replacing it for the oscillation signal edge realigns the oscillation signal, adjusts a timing of the oscillation signal (since the reference signal edge becomes the new oscillation signal edge at the injection point), and thus reduces jitter and phase noise of the oscillation signal. In various implementations, the reference signal may be injected according to a predetermined frequency and/or pattern, as desired to control jitter of the oscillator 400. In alternate implementations, the reference signal may be injected using other components (rather than a multiplexer 404, for instance) that allow the reference signal edge to replace a corresponding oscillation signal edge at multiple points within an oscillator 106 or 400.

In one implementation, the reference signal is injected once per reference signal cycle, as shown in FIG. 4B. In other words, at least one enable signal received at a multiplexer 404 is activated to the first state at every cycle of the reference signal. For example, as shown in FIG. 4B, each rising edge of the reference signal is shown injected onto the oscillation signal at the oscillation frequency, replacing a corresponding rising edge of the oscillation signal at that point. The reference signal edge is injected at various points (e.g., multiplexers 404) during successive cycles. In other implementations, the reference signal is injected according to other pre-determined patterns, based at least in part on a resolution of the oscillator 400.

Figure 5:
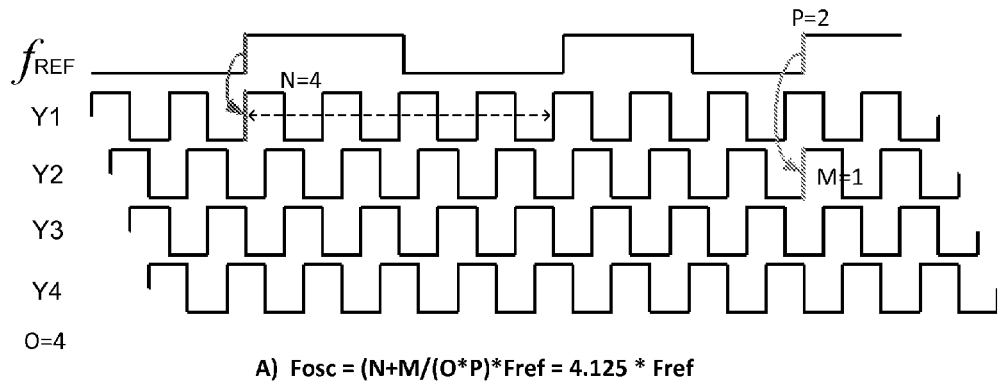
FIGS. 5 and 6 are example signal diagrams showing higher resolution multi-point reference signal injection, according to implementations.
Figure 5:
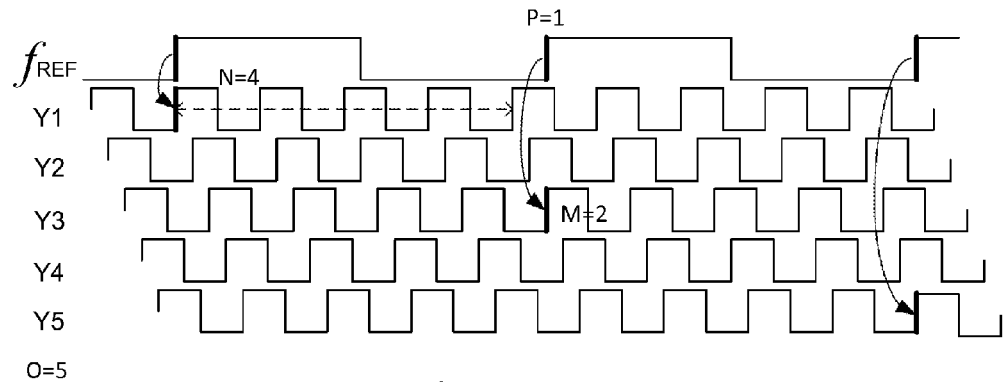
Figure 5:
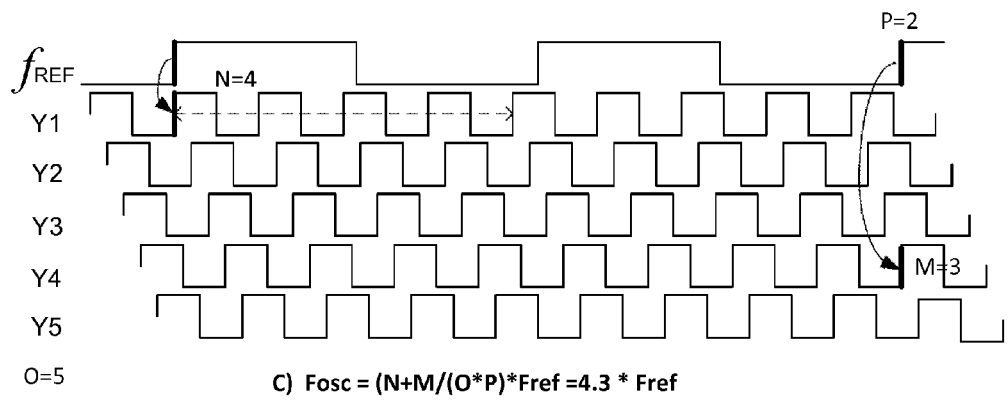
Figure 6:
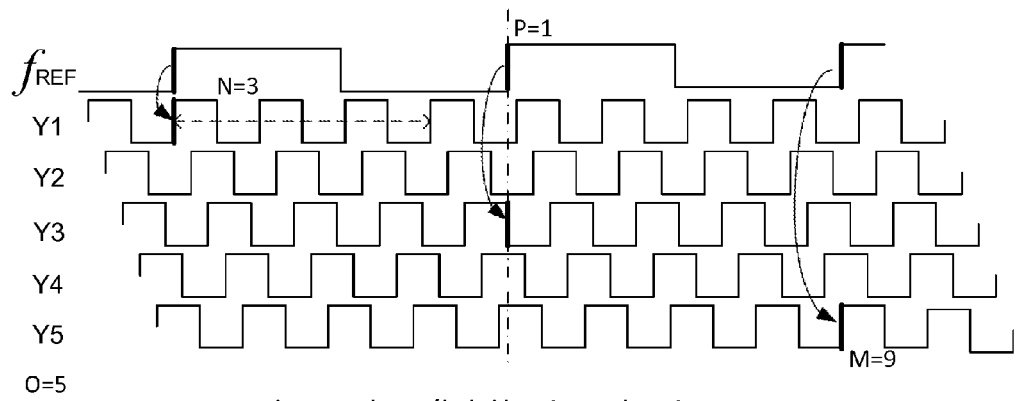
Figure 6:
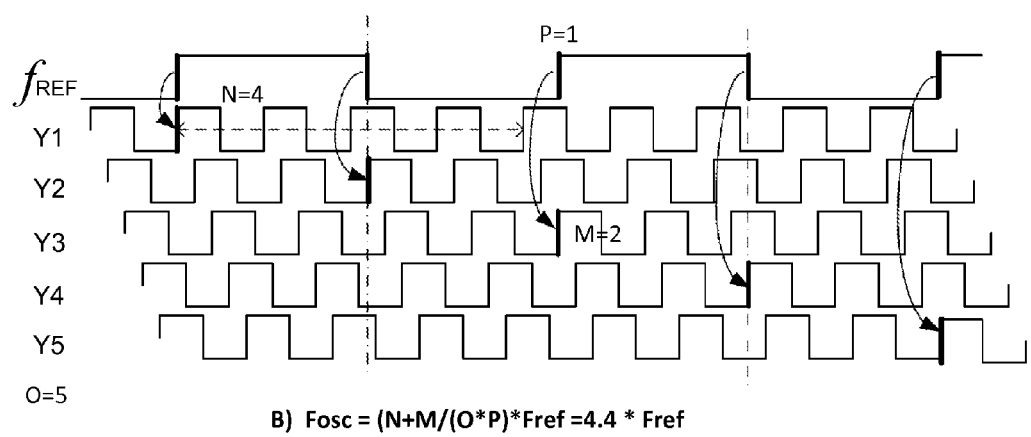

In an implementation, as shown in FIGS. 4B, 5 and 6, each of the multiplexers 404 of the oscillator 400 is enabled independently. For example, an enable signal at a first multiplexer 404 of the plurality of multiplexers and an enable signal at a second multiplexer 404 of the plurality of multiplexers are not in the first state (e.g., an enabling state) simultaneously. In one example, as shown in FIG. 4B, the multiplexers 404 of the plurality of multiplexers are enabled in an order that is not sequential to an order of their electrical coupling within the circuit 400. in alternate implementations, multiple multiplexers 404 may be enabled simultaneously and multiplexers may be enabled in an order of their electrical coupling within the circuit 400.

In another implementation, the oscillator circuit 400 is capable of synthesizing an output frequency that is a fractional multiple of the reference frequency, based on the multiple inverter 402/multiplexer 404 stages of the circuit 400. In the implementation, the multiplexers 404 of the plurality of multiplexers are subsequently enabled (in a predetermined order, for example) at a frequency comprising a combination of an integer multiplication factor and a fractional multiplication factor of a frequency of the reference signal. In an implementation, the possible output frequencies can be described with the formula:

$$F_{PLL} = F_{REF} * (N + M/O)$$

where $0 <= M <= (O-1)$ and N comprises the integer multiplication factor, M comprises the fractional multiplication factor, and O comprises the resolution of the number of stages of the oscillator 400. Accordingly, an edge of the reference signal is replaced for a corresponding edge of the oscillation signal at the integer/fractional frequency. This is illustrated with the arrows of FIGS. 5 and 6, which show timing diagrams of example 4 and 5 stage circuits 400. For the purposes of this disclosure, a corresponding edge to a reference signal edge is an oscillation signal edge that is occurring at the same time as the reference signal edge (assuming an ideal system without any presence of jitter).

In an example implementation, higher resolution fractional oscillation frequencies can be achieved with more inverter 402/multiplexer 404 stages of the circuit 400. In various implementations, higher resolution frequencies that include a fractional multiple of the reference frequency can be achieved by increasing the effective number of inverter 402/multiplexer 404 stages of the circuit 400. In alternate implementations, higher resolution fractional oscillation frequencies can be achieved by increasing a combination of physical and effective stages. Also, as shown in FIG. 5, greater resolution can be achieved when the injection occurs at every second, third, etc. reference cycle (P). In an implementation, the possible output frequencies can be described with the formula:

$$F_{PLL}=F_{REF}*(N+M/(O*P))$$

where $0<=M<=(O+P)-1$, and P represents the injection interval of the reference cycle. For example, P=2 means that the injection takes place every second cycle of the reference signal, P=3 means that the injection takes place every third cycle of the reference signal, and so forth.

In the example illustrated by the timing diagram of FIG. 5A, the oscillation frequency is 4.125 times the reference frequency, for instance. In this case, by injecting at every second reference edge, the effective number of stages (of a 4 stage ring oscillator) is increased by a factor of 2 (e.g., P=2). In one example, injection strength goes down, which leads to a decrease of the cutoff frequency (as shown in FIG. 3B) by a factor of P (=2).

FIG. 5B illustrates an example 5 stage ring oscillator, with injection at each reference edge and a fractional multiplier (M) of 2. The result is an output frequency that is 4.4 times the reference frequency. FIG. 5C illustrates an example 5 stage ring oscillator, with injection at every second reference edge and a fractional multiplier (M) of 3. The result is an output frequency that is 4.3 times the reference frequency.

In other implementations, an increase of resolution can be achieved by injecting rising and/or falling edges of the reference signal onto falling edges of the oscillation signal (which can be in addition to injecting onto rising edges of the oscillation signal). In the implementations, a rising or falling edge of the reference signal may be injected onto a rising or a falling edge of the oscillation signal, replacing a corresponding rising or falling edge of the oscillation signal at a predetermined point of the oscillator 400, such as at an output of an enabled multiplexer 404. This is illustrated with the example timing diagrams of FIGS. 6A and 6B, for example.

In the example illustrated by the timing diagram of FIG. 6A, the oscillation frequency is 3.9 times the reference frequency, for instance. In this case, by injecting (rising edges of the reference signal) onto the falling edges of the oscillation signal, the effective number of stages (of a 5 stage ring oscillator) is increased by a factor of 2 (e.g., O=10, instead of 5, as in FIG. 5C), assuming the oscillator signal has an ideal duty cycle of 50%, for example. In the example illustrated by the timing diagram of FIG. 6B, the oscillation frequency is 4.4 times the reference frequency, for instance. In this case, by injecting on the rising as well as the falling edges of the reference signal (e.g., onto rising edges of the oscillation signal, for example), the effective number of stages is not increased. Instead, the injection strength is increased, which leads to an increase of the cutoff frequency in the phase noise plot (shown in FIG. 3B) by a factor of 2 (assuming the reference clock has an ideal duty cycle of 50%, for example).

Figure 7:
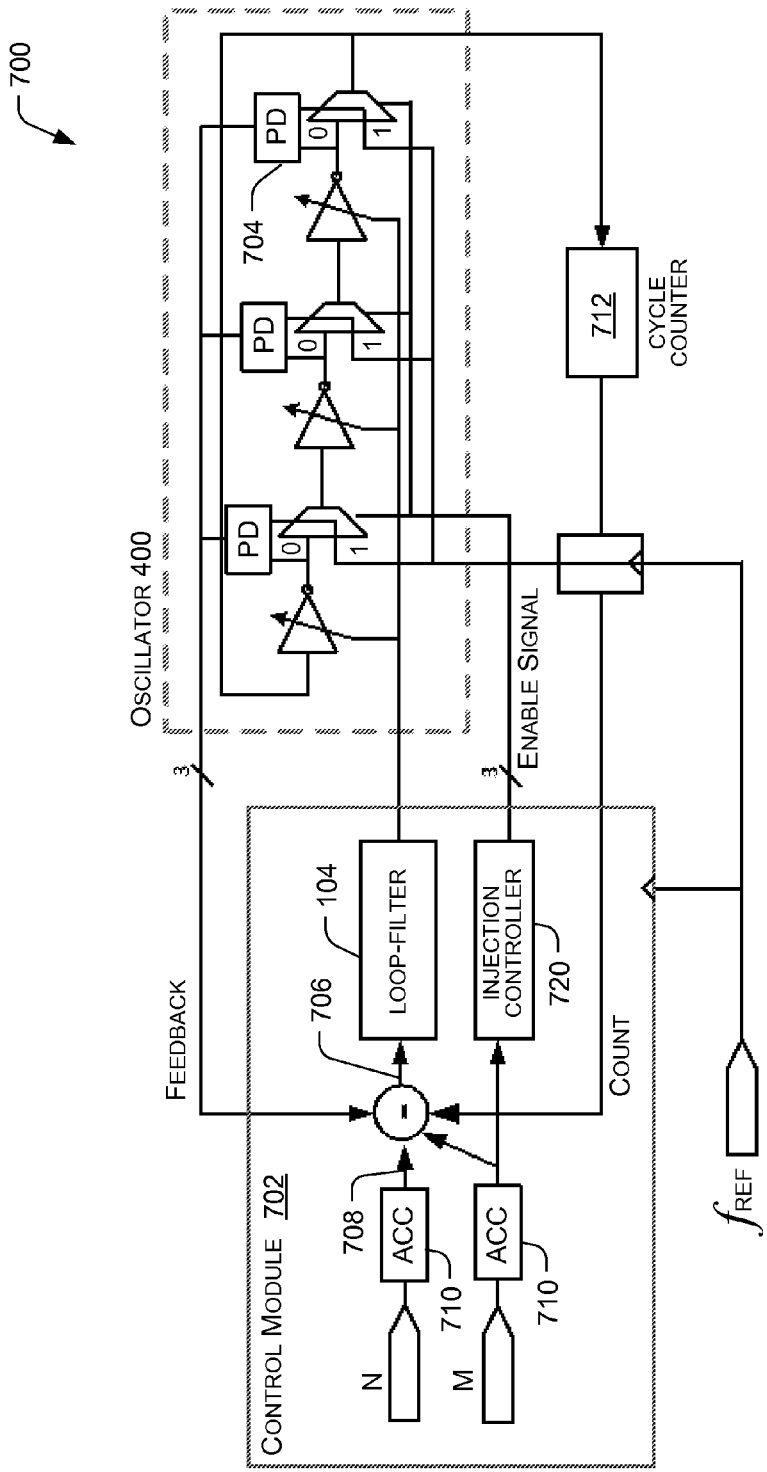
FIG. 7 is a schematic diagram of an example PLL circuit including an oscillator with multi-point injection, according to an implementation.

In an implementation as shown in FIG. 7, a PLL arrangement ("PLL") 700 (i.e., PLL system) can include a multi-stage oscillator arrangement 400. As shown in FIG. 7, the oscillator 400 comprises a multi-stage ring oscillator circuit, including a plurality of inverters 402 (e.g., inverting stages) and a plurality of multiplexers 404 (e.g., multiplexing stages) alternately coupled in a loop, as described above. In an implementation, the multi-stage oscillator arrangement 400 generates an output signal of the PLL system 700, comprising an oscillation signal.

In various implementations, a multiplexer 404 is coupled to an output of each inverter 402 at a first input of the multiplexer 404 and an inverter 402 is coupled to an output of each multiplexer 404 at an input of the inverter 402. In one implementation, the multi-stage oscillator arrangement 400 comprises a digitally controlled ring oscillator (DCRO) and includes a tuning matrix of inverter stages coupled in parallel to the plurality of inverters 402 to drive a frequency of the multi-stage ring oscillator circuit 400 to a desired frequency value. In alternate implementations, the multi-stage oscillator arrangement 400 comprises another configuration, type, or design of oscillator arrangement, for example an analog voltage controlled oscillator (VCO), or the like.

In an implementation, the PLL 700 includes a control module 702 arranged to enable each of the plurality of multiplexers 404 via an enable signal, according to a predetermined pattern. In the implementation, each multiplexer 404 is arranged to receive a reference signal ("Fref") at a second input of the multiplexer 404 and to output the reference signal when the enable signal from the control module 702 is in a first state and to output an oscillation signal received at the first input of the multiplexer 404 when the enable signal is in a second state.

In an implementation, the control module 702 comprises a digital control module, and is comprised digital components clocked with the reference signal. In alternate implementations, the control module 702 is an analog control module.

In an implementation, the PLL 700 includes an injection controller 720 arranged to determine which phase of the multi-stage ring oscillator circuit 400 to enable a multiplexer 404 of the plurality of multiplexers via the enable signal according to a predetermined pattern.

As shown in FIG. 7, in an implementation, the PLL 700 includes a plurality of phase detectors 704. For instance, the PLL 700 may include a phase detector 704 for each stage of the oscillator 400, or the PLL 700 may include fewer or more phase detectors 704. In the implementation, a phase detector 702 is coupled to the output of each inverter 402 (at a first input of the phase detector 704) and to the reference signal (at a second input of the phase detector 704) and arranged to detect a phase difference between the oscillation signal and the reference signal. The phase detector 704 feeds back a difference signal to the control module 702 based on the detecting.

In an implementation, a phase detector 702 senses the phase difference or "phase error" between signals at the two inputs of the phase detector 702 and outputs a signal that represents the phase error. For example, the phase detector 702 can detect whether the reference clock signal edge leads or lags the oscillation signal edge (output from an inverter 402). In one implementation, the phase detector 702 is a binary (or "bang-bang") phase detector. In the implementation, the output of the phase detector 702 is a binary value, generally either a 1 or a 0, to indicate the leading or a lagging phase error.

As shown in FIG. 7 in an implementation, the PLL 700 includes a loop filter 104 arranged to receive an aggregate signal 706 including one or more frequency control signals 708 and feedback from the multi-stage ring oscillator circuit 400. In the implementation, the loop filter 104 tunes a frequency of the multi-stage ring oscillator circuit 400 based on the aggregate signal 706. For example, as shown in FIG. 7, a frequency control signal 708 can comprise an accumulated signal (via accumulators 710) based on a frequency control word (M, N). The feedback signal includes a phase error between the oscillation signal and the reference signal (from the phase detector(s) 704), and the aggregate signal 706 includes the phase error (from the feedback) subtracted from the frequency control signal 708.

In an implementation, as shown in FIG. 7, the PLL 700 includes a cycle counter 712 coupled to an output of one of the multiplexers 404. in the implementation, the cycle counter 712 counts a quantity of cycles of the multi-stage ring oscillator circuit 400 (e.g., the loop) and outputs a result signal sampled by the reference clock to the control module 702 based on the counting. For example, the cycle counter 712 outputs the frequency relationship between the oscillator clock and the reference clock. In some implementations, in order to save current, the cycle counter 712 can be switched off completely after the PLL 700 reaches lock condition (frequency acquisition step). In other implementations, the PLL 700 may be comprised of analog components, such as a charge pump and analog loop filter, and may not include the cycle counter 712 or other digital components or may include a feedback divider instead of the cycle counter.

In alternate implementations, the oscillator 400 and/or the PLL 700 may include fewer, additional, or alternate components and remain within the scope of the disclosure. Further, the techniques, components, and devices described herein with respect to the implementations are not limited to the illustrations in FIGS. 1-7, and may be applied to other oscillators 106 or 400 and/or PLLs 100 or 700, including various devices and designs, without departing from the scope of the disclosure. In some cases, additional or alternative components may be used to implement the techniques described herein. Further, the components may be arranged and/or combined in various combinations. It is to be understood that an oscillator 400 and/or a PLL 700 may be implemented as a stand-alone device or as part of another system (e.g., integrated with other components, systems, etc.).

In various implementations, additional or alternative components may be used to accomplish the disclosed techniques and arrangements.

Representative Process

Figure 8:
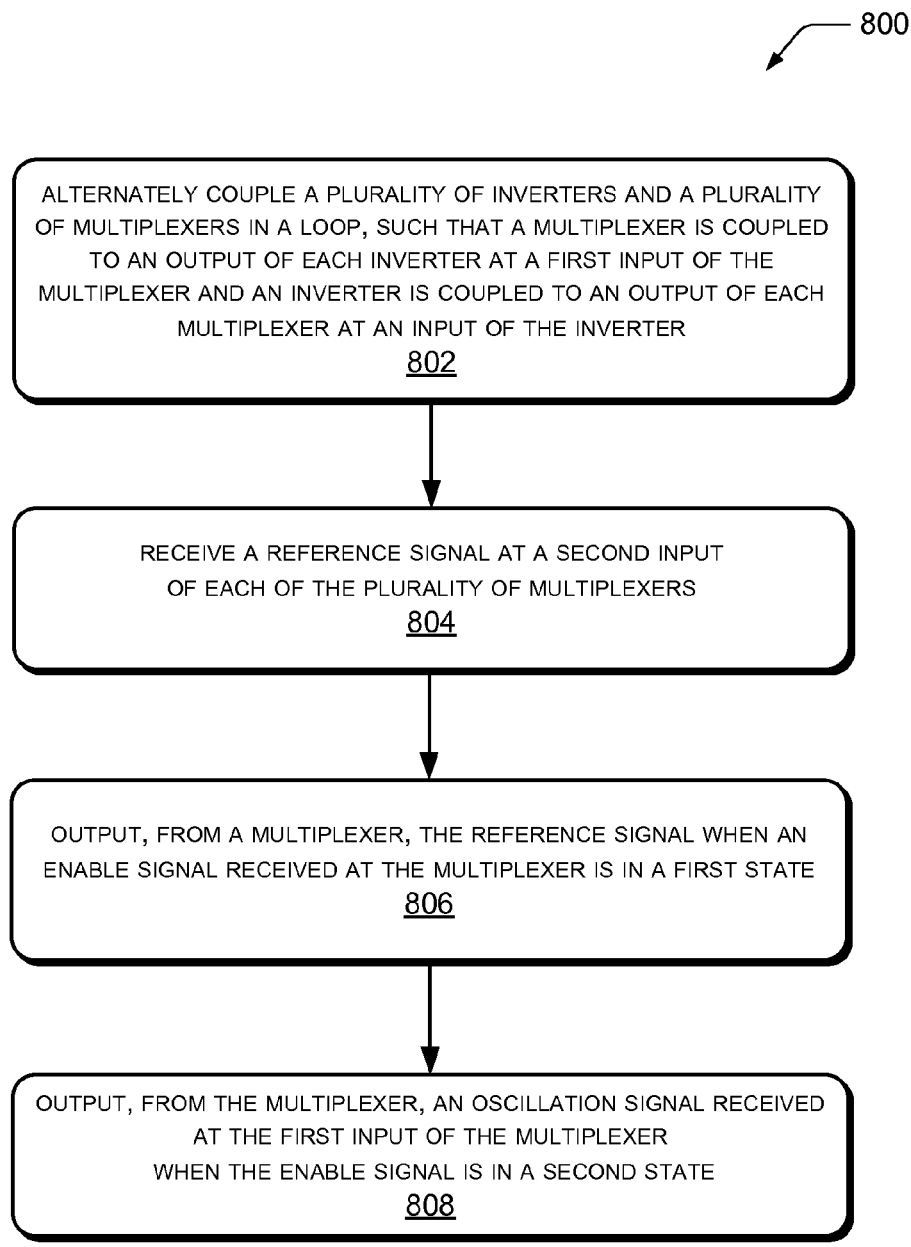
FIG. 8 is a flow diagram illustrating an example process for reducing jitter of an oscillator, according to an implementation.

FIG. 8 is a flow diagram illustrating an example process 800 for reducing jitter of an oscillator (such as an oscillator 106 or 400, for example) and generating higher resolution output frequencies at a PLL (such as PLL 700, for example) including the oscillator, that include fractional multiples of the reference frequency, according to an implementation. The process 800 is described with reference to FIGS. 1-7.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 802, the process includes alternately coupling a plurality of inverting stages (such as inverters 402, for example) and a plurality of multiplexing stages (such as multiplexers 404, for example) in a loop, such that a multiplexer is coupled to an output of each inverter at a first input of the multiplexer and an inverter is coupled to an output of each multiplexer at an input of the inverter. In an implementation, the process includes generating an oscillation signal via the plurality of inverters and the plurality of multiplexers in the loop. For example, in an implementation, the plurality of inverters and the plurality of multiplexers comprise an oscillator (such as an oscillator 400, for example). In one implementation, the plurality of inverters and the plurality of multiplexers comprise a realigned digitally controlled ring oscillator (DCRO) with built in phase-detectors (such as phase detectors 704, for example).

At block 804, the process includes receiving a reference signal at a second input of each of the plurality of multiplexers. At block 806, the process includes outputting, from a multiplexer, the reference signal when an enable signal received at the multiplexer is in a first state (e.g., an enable state). In an implementation, this comprises injecting an edge of the reference signal onto the oscillation signal when the multiplexer is enabled.

At block 808, the process includes outputting, from the multiplexer, an oscillation signal received at the first input of the multiplexer when the enable signal is in a second state (e.g., non-enabled state). In an implementation, the enable signal comprises a binary selection signal, and indicates a selection of the reference signal in the first binary state and indicates a selection of the oscillation signal in the second binary state (or vice versa, depending on the inputs of the multiplexer 404). In the implementation, the selected signal is output from the multiplexer 404.

In an implementation, the process includes reducing jitter of the oscillation signal by opening the loop and replacing an edge of the oscillation signal by an edge of the reference signal according to a predetermined frequency. In another implementation, the process includes generating a higher resolution output frequency that includes a fractional multiple of the reference frequency by replacing an edge of the oscillation signal by an edge of the reference signal according to a predetermined frequency.

For example, in one implementation, a rising edge of the reference signal is replaced for a rising edge of the oscillation signal when a multiplexer is enabled. In another implementation, the resolution of the oscillator output may be increased by injecting a rising or falling edge of the reference frequency onto a falling edge of the oscillation signal. In other words, a rising or falling edge of the reference signal is replaced for a falling edge of the oscillation signal when a multiplexer is enabled. In further implementations, predetermined combinations of rising and falling edges of the reference signal are replaced for rising edges of the oscillation signal or combinations of rising and falling edges of the oscillation signal. In various cases, greater output frequency resolution (e.g., including fractional frequency multiples of the reference frequency) are generated and/or the injection strength is increased or decreased based on replacing edges of the reference signal for edges of the oscillation signal at predetermined frequencies.

In some examples, the effective number of oscillator stages is increased when the edges of the oscillation signal are replaced by edges of the reference signal less frequently. In other examples, the effective number of oscillator stages is increased when some falling edges of the oscillation signal are replaced by edges of the reference signal, in addition to some rising edges of the oscillation signal. Further, in other examples, the injection strength of the oscillator is increased when the edges of the oscillation signal are replaced by edges of the reference signal more frequently. In such cases, the cutoff frequency of the phase noise plot is increased (in some cases proportionately).

In an implementation, the process includes using control logic (such as control module 702, for example) to determine which edge of the oscillation signal to inject an edge of the reference signal onto (e.g., which edge of the oscillation signal to replace with an edge of the reference signal)

and/or which multiplexer to enable. In an example, the control logic is implemented in digital logic. In one implementation, the control logic is clocked with the reference signal. In alternate implementations, the control logic is implemented using other components, logic types, designs, and the like.

In an implementation, the process includes independently enabling each multiplexer of the plurality of multiplexers via an enable signal according to a predetermined frequency and/or a predetermined pattern. In one example, the process includes enabling a multiplexer and injecting a reference signal edge at every cycle of the reference signal. In another example, the predetermined frequency comprises a combination of an integer multiplication factor and a fractional multiplication factor of a frequency of the reference signal. In a further example, a resolution of the oscillator may be increased by enabling a multiplexer and injecting a reference edge at every second, third, etc. cycle of the reference signal.

In various implementations, the multiplexers of the plurality of multiplexers are enabled in an order different from the order in which they are electrically coupled in a loop within the oscillator. In an example, the multiplexers are enabled in an order based on a correlation of an edge of the reference signal and an edge of the oscillation signal (e.g., the multiplexer is enabled where an edge of the reference signal is occurring at the same time as the oscillation signal (assuming an ideal system without any presence jitter).

In an implementation, the oscillator is included as part of a phase-locked loop (PLL) arrangement or system (such as PLL 700, for example). In an implementation, the process includes locking the PLL in two steps (which may be combined into a single step or divided into a greater number of steps in alternate implementations). In the implementation, the two steps include acquiring an oscillation frequency and locking injection.

In an implementation, the process includes acquiring an oscillation frequency, including: evaluating a phase difference between the reference signal and the oscillation signal; sampling a cycle counter clocked by the oscillation signal at a frequency of the reference signal to represent frequency and phase information; subtracting the frequency information of the phase difference from an accumulated frequency control word to determine an aggregate phase error signal; and tuning a frequency of the oscillation signal based on the aggregate signal.

In an implementation, acquiring an oscillation frequency also includes monitoring for a lock indication based on the phase difference and locking the phase-locked loop (PLL) when the phase difference is less than a predetermined threshold. In another implementation, the aggregate phase error signal is fed into a loop filter which tunes the oscillator to an oscillation signal frequency. In a further implementation, a feedback divider can be used instead of the cycle counter, and the frequency information of the phase difference can be determined using another technique, if used. After acquiring the lock condition the cycle counter can be switched off to conserve current and lock can be held by relying on the phase difference, assuming frequency information stays the same during the locked condition (e.g. BangBang operation)

In an implementation, the process includes injection locking, including: determining a phase of the oscillation signal for injection of an edge of the reference signal; evaluating a phase difference between the oscillation signal and the reference signal; driving the oscillation signal to a higher frequency when the edge of the reference signal leads a corresponding edge of the oscillation signal; and driving the oscillation signal to a lower frequency when the edge of the reference signal lags a corresponding edge of the oscillation signal.

In an implementation, locking injection also includes evaluating an accumulated value of at least a portion of a frequency control word and tuning a frequency of the oscillation signal based on the accumulated value and the phase difference.

In an implementation, the phase detectors use a bang-bang operation technique (e.g., a binary output technique) to enable the PLL to compensate for temperature and voltage drifts. In the implementation, the bang-bang operation technique also reduces reference spurs due to the injection, because the loop tries to regulate the oscillator clock edge as close as possible to the reference clock edge, which also decreases the jitter as a consequence.

In alternate implementations, other techniques may be included in the process 700 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A ring oscillator circuit, comprising:
   a plurality of inverters; and
   a plurality of multiplexers, a multiplexer coupled to an output of each inverter at a first input of the multiplexer and an inverter coupled to an output of each multiplexer at an input of the inverter,
   each multiplexer arranged to receive a reference signal at a second input of the multiplexer and to output the reference signal when an enable signal received at the multiplexer is in a first state and to output an oscillation signal received at the first input of the multiplexer when the enable signal is in a second state, wherein the reference signal comprises a periodic pulse signal having a rising edge and a falling edge on each pulse, one of the rising edge or the falling edge replacing an edge of the oscillation signal at an output of a multiplexer when the enable signal received at the multiplexer is in the first state.

2. The ring oscillator circuit of claim 1, wherein the plurality of inverters and the plurality of multiplexers are arranged in a loop and generate the oscillation signal, and wherein the loop is opened at periodic intervals and an edge of the reference signal replaces an edge of the oscillation signal at the intervals.

3. The ring oscillator circuit of claim 2, wherein the replacement of the edge of the reference signal for the edge of the oscillation signal adjusts a timing of the oscillation signal.

4. The ring oscillator circuit of claim 1, wherein an enable signal at a first multiplexer of the plurality of multiplexers and an enable signal at a second multiplexer of the plurality of multiplexers are not in the first state simultaneously.

5. The ring oscillator circuit of claim 1, wherein at least one enable signal received at a multiplexer is activated to the first state at every cycle of the reference signal.

6. The ring oscillator circuit of claim 1, wherein the multiplexers of the plurality of multiplexers are subsequently enabled at a frequency comprising a combination of an integer multiplication factor and a fractional multiplication factor of a frequency of the reference signal.

7. The ring oscillator circuit of claim 6, wherein the multiplexers of the plurality of multiplexers are enabled in an order that is not sequential to an order of their electrical coupling within the circuit.

8. A phase-locked loop (PLL) system, comprising:
a multi-stage ring oscillator circuit, including a plurality of inverters and a plurality of multiplexers alternately coupled in a loop, a multiplexer coupled to an output of each inverter at a first input of the multiplexer and an inverter coupled to an output of each multiplexer at an input of the inverter; and
a digital control module arranged to enable each of the plurality of multiplexers via an enable signal according to a predetermined pattern, each multiplexer arranged to receive a reference signal at a second input of the multiplexer and to output the reference signal when the enable signal received at the multiplexer is in a first state and to output an oscillation signal received at the first input of the multiplexer when the enable signal is in a second state.

9. The PLL system of claim 8, further comprising a plurality of phase detectors, a phase detector coupled to the output of each inverter and to the reference signal and arranged to detect a phase difference between the oscillation signal and the reference signal and to feed back a difference signal to the digital control module based on the detecting.

10. The PLL system of claim 9, further comprising a cycle counter coupled to an output of one of the multiplexers and arranged to count a quantity of cycles of the multi-stage ring oscillator circuit and to output a result signal to the digital control module based on the counting.

11. The PLL system of claim 9, further comprising a loop filter arranged to receive an aggregate signal including a frequency control signal and feedback from the multi-stage ring oscillator circuit and to tune a frequency of the multi-stage ring oscillator circuit based on the aggregate signal.

12. The PLL system of claim 11, wherein the frequency control signal comprises an accumulated signal based on a frequency control word and the feedback includes a phase error between the oscillation signal and the reference signal, and wherein the aggregate signal includes the phase error subtracted from the frequency control signal.

13. The PLL system of claim 9, further comprising an injection controller arranged to determine which phase of the multi-stage ring oscillator circuit to enable a multiplexer of the plurality of multiplexers via the enable signal according to the predetermined pattern.

14. The PLL system of claim 9, wherein the digital control module is comprised of digital components clocked via the reference signal.

15. The PLL system of claim 9, wherein the multi-stage ring oscillator circuit comprises a digitally controlled ring oscillator (DCRO) and includes a tuning matrix of inverter stages coupled in parallel to the plurality of inverters to drive a frequency of the multi-stage ring oscillator circuit to a desired frequency value.

16. The PLL system of claim 9, wherein the multi-stage ring oscillator circuit comprises an analog voltage controlled oscillator (VCO).

17. A method, comprising:
alternately coupling a plurality of inverters and a plurality of multiplexers in a loop, such that a multiplexer is coupled to an output of each inverter at a first input of the multiplexer and an inverter is coupled to an output of each multiplexer at an input of the inverter;
receiving a reference signal at a second input of each of the plurality of multiplexers;
outputting, from a multiplexer, the reference signal when an enable signal received at the multiplexer is in a first state; and
outputting, from the multiplexer, an oscillation signal received at the first input of the multiplexer when the enable signal is in a second state, wherein the reference signal comprises a periodic pulse signal having a rising edge and a falling edge on each pulse, one of the rising edge or the falling edge replacing an edge of the oscillation signal at an output of a multiplexer when the enable signal received at the multiplexer is in the first state.

18. The method of claim 17, further comprising independently enabling each multiplexer of the plurality of multiplexers via the enable signal according to a predetermined frequency comprising a combination of an integer multiplication factor and a fractional multiplication factor of a frequency of the reference signal.

19. The method of claim 18, further comprising generating the oscillation signal via the plurality of inverters and the plurality of multiplexers in the loop, and reducing jitter of the oscillation signal by opening the loop and replacing an edge of the oscillation signal by an edge of the reference signal according to the predetermined frequency.

20. The method of claim 18, further comprising generating the oscillation signal via the plurality of inverters and the plurality of multiplexers in the loop, and adjusting a resolution of a frequency of the oscillation signal by adjusting the predetermined frequency and opening the loop and replacing an edge of the oscillation signal by an edge of the reference signal according to the adjusted predetermined frequency.

21. The method of claim 18, further comprising generating the oscillation signal via the plurality of inverters and the plurality of multiplexers in the loop, and adjusting a resolution of a frequency of the oscillation signal by opening the loop and replacing a rising and/or falling edge of the oscillation signal by a rising and/or a falling edge of the reference signal according to a predetermined combination.

22. The method of claim 17, further comprising acquiring an oscillation frequency, including:
evaluating a phase difference between the reference signal and the oscillation signal;
sampling a cycle counter clocked by the oscillation signal at a frequency of the reference signal to represent frequency information of the phase difference;
subtracting the frequency information of the phase difference from an accumulated frequency control word signal to determine an aggregate phase error signal; and
tuning a frequency of the oscillation signal based on the aggregate signal.

23. The method of claim 22, further comprising monitoring for a lock indication based on the phase difference and locking a phase-locked loop (PLL) when the phase difference is less than a predetermined threshold.

24. The method of claim 17, further comprising locking injection, including:
determining a phase of the oscillation signal for injection of an edge of the reference signal;
evaluating a phase difference between the oscillation signal and the reference signal;
driving the oscillation signal to a higher frequency when the edge of the reference signal leads a corresponding edge of the oscillation signal; and driving the oscillation signal to a lower frequency when the edge of the reference signal lags a corresponding edge of the oscillation signal.

25. The method of claim 24, further comprising evaluating an accumulated value of at least a portion of a frequency control word and tuning a frequency of the oscillation signal based on the accumulated value and the phase difference.

26. A phase-locked loop (PLL) system, comprising:
a multi-stage ring oscillator circuit, including a quantity of inverters and a same quantity of multiplexers alternately coupled in a loop, a multiplexer coupled to an output of each inverter at a first input of the multiplexer and an inverter coupled to an output of each multiplexer at an input of the inverter, the multi-stage ring oscillator circuit arranged to generate an output of the PLL system comprising an oscillation signal; and
a digital control module arranged to tune a frequency of the multi-stage ring oscillator circuit based on an aggregated control word, to determine a phase of the oscillation signal for injection of an edge of a reference signal, and to enable a multiplexer to insert the edge of the reference signal in place of a corresponding edge of the oscillation signal according to a predetermined pattern.

* * * * *